US012796545B2

(12) United States Patent
Ju

(10) Patent No.: US 12,796,545 B2
(45) Date of Patent: Nov. 10, 2026

(54) SEMICONDUCTOR PACKAGE INCLUDING SEMICONDUCTOR CHIPS STACKED IN STAGGERED MANNER

(71) Applicant: SK hynix Inc., Icheon-si (KR)

(72) Inventor: Hyeon Seok Ju, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 772 days.

(21) Appl. No.: 18/187,599

(22) Filed: Mar. 21, 2023

(65) Prior Publication Data

US 2024/0021580 A1 Jan. 18, 2024

(30) Foreign Application Priority Data

Jul. 15, 2022 (KR) ........................ 10-2022-0087602

(51) Int. Cl.

*H10W 90/00* (2026.01)
*H10W 20/20* (2026.01)
*H10W 72/00* (2026.01)

(52) U.S. Cl.

CPC ........... *H10W 90/00* (2026.01); *H10W 20/20* (2026.01); *H10W 90/701* (2026.01); *H10W 72/884* (2026.01); *H10W 90/732* (2026.01); *H10W 90/734* (2026.01); *H10W 90/754* (2026.01)

(58) Field of Classification Search

CPC ............................................. H01L 2225/06562
See application file for complete search history.

(56) References Cited

U.S. PATENT DOCUMENTS

2011/0079890 A1 4/2011 Song et al.
2017/0373040 A1 12/2017 Pagani
2021/0074679 A1 * 3/2021 Lee ......................... H01L 25/50

FOREIGN PATENT DOCUMENTS

JP 2004158536 A 6/2004
KR 1020070009776 A 1/2007

* cited by examiner

*Primary Examiner* — Yu-Hsi D Sun
(74) *Attorney, Agent, or Firm* — WILLIAM PARK AND ASSOCIATES LTD.

(57) ABSTRACT

A semiconductor package includes a package substrate, a first semiconductor chip disposed over the package substrate, and a second semiconductor chip stacked over the first semiconductor chip. Each of the first and second semiconductor chips includes a chip body, first chip pads disposed in a first region of a surface of the chip body, and second chip pads disposed in a second region of the surface of the chip body. The first chip pads of the first semiconductor chip and the first chip pads of the second semiconductor chip are disposed at opposite sides from each other over the package substrate. The second chip pads of the first semiconductor chip and the second chip pads of the second semiconductor chip are disposed at opposite sides from each other over the package substrate.

17 Claims, 14 Drawing Sheets

SEMICONDUCTOR PACKAGE INCLUDING SEMICONDUCTOR CHIPS STACKED IN STAGGERED MANNER

CROSS-REFERENCE TO RELATED APPLICATION

The present application claims priority under 35 U.S.C. 119(a) to Korean Application No. 10-2022-0087602, filed on Jul. 15, 2022, which is incorporated herein by reference in its entirety.

BACKGROUND

1. Technical Field

The present disclosure generally relates to a semiconductor package including stacked semiconductor chips.

2. Related Art

A stack-type semiconductor package may include a plurality of semiconductor chips vertically stacked on a package substrate. One method for electrically connecting the plurality of semiconductor chips to the package substrate in the stack-type semiconductor package is wire bonding. Specifically, chip pads disposed on the plurality of semiconductor chips and bond fingers disposed on the package substrate may be connected through bonding wires, and the plurality of semiconductor chips and the package substrate may exchange electrical signals to each other through the bonding wires.

Meanwhile, when an upper semiconductor chip is stacked over a lower semiconductor chip that is wire-bonded to a package substrate, the upper semiconductor chip may be disposed not to screen the bonding wires of the lower semiconductor chip. In this case, to maintain structural reliability of the bonding wires of the lower semiconductor chip, the upper semiconductor chip may have various arrangements.

SUMMARY

According to an embodiment of the present disclosure, a semiconductor package may include a package substrate, a first semiconductor chip disposed over the package substrate, and a second semiconductor chip stacked over the first semiconductor chip. Each of the first and second semiconductor chips may include a chip body, first chip pads disposed in a first region of a surface of the chip body along a first edge line of the chip body, and second chip pads disposed in a second region of the surface of the chip body along a second edge line of the chip body intersecting the first edge line. The first chip pads of the first semiconductor chip and the first chip pads of the second semiconductor chip may be disposed at opposite sides from each other over the package substrate. The second chip pads of the first semiconductor chip and the second chip pads of the second semiconductor chip may be disposed at opposite sides from each other over the package substrate. The second semiconductor chip may be disposed to be offset with respect to the first semiconductor chip to expose the first chip pads and the second chip pads of the first semiconductor chip.

According to another embodiment of the present disclosure, a semiconductor package may include a package substrate, and first and second semiconductor chips stacked over the package substrate. Each of the first and second semiconductor chips may include a chip body, first chip pads disposed in a first region of a surface of the chip body along a first edge line of the chip body, and second chip pads disposed in a second region of the surface of the chip body along a second edge line of the chip body intersecting the first edge line. The second semiconductor chip, after being substantially rotated by 180° with respect to a center of the second semiconductor chip while overlapping with the first semiconductor chip, may be offset in a first direction parallel to the first edge line of the first semiconductor chip and offset in a second direction parallel to the second edge line of the first semiconductor chip.

DETAILED DESCRIPTION

Figure 1:
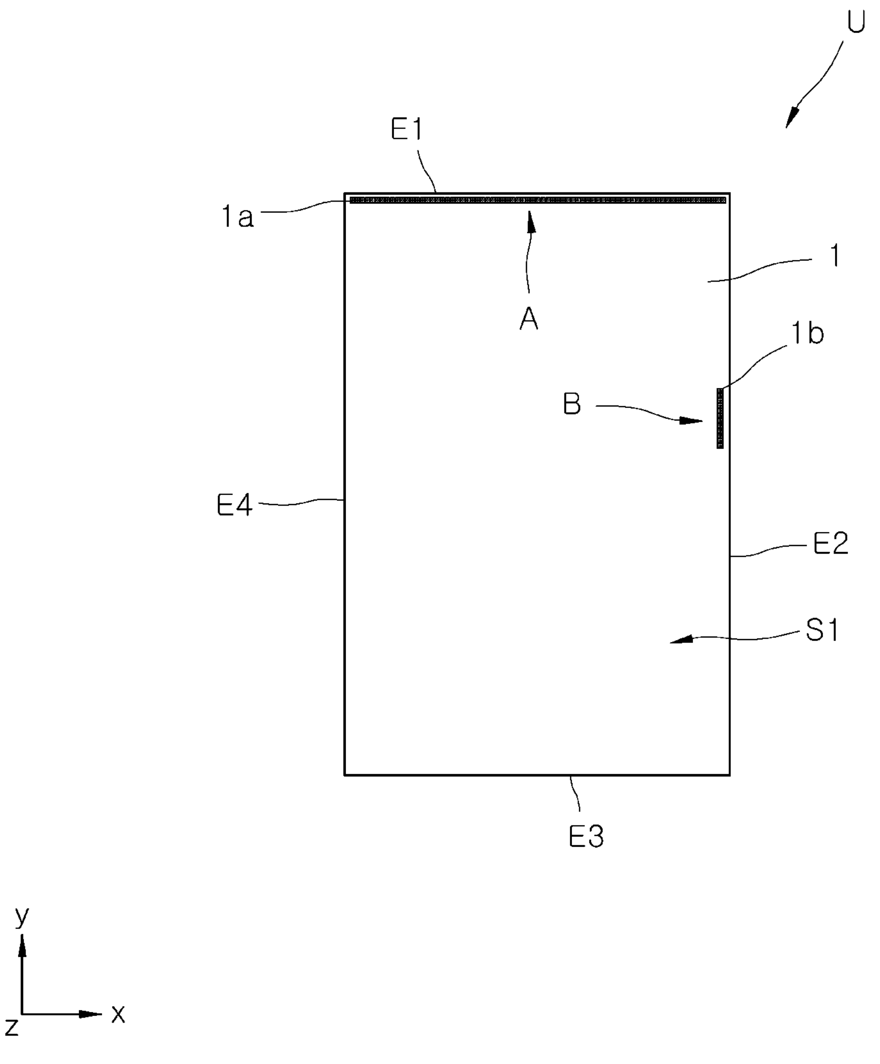
FIG. 1 is a plan view schematically illustrating a semiconductor chip according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms maybe construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms “comprise”, “include”, or “have” are intended to specify the presence of a feature, a number, a step, an operation, a component, an element, a part, or combinations thereof, but not used to preclude the presence or possibility of the addition of one or more other features, numbers, steps, operations, components, elements, parts, or combinations thereof.

In this specification, a semiconductor chip may mean that a semiconductor substrate on which electronic circuits are integrated has a form in which chips are distinguished from each other. The semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs). Meanwhile, the semiconductor chip may also be referred to as a semiconductor die.

Same reference numerals refer to same devices throughout the specification. Even though a reference numeral might not be mentioned or described with reference to a drawing, the reference numeral may be mentioned or described with reference to another drawing. In addition, even though a reference numeral might not be in a drawing, it may be illustrated in another drawing.

FIG. 1 is a plan view schematically illustrating a semiconductor chip U according to an embodiment of the present disclosure. The semiconductor chip U of FIG. 1 may include a chip body 1, first chip pads 1*a* and second chip pads 1*b* that are disposed on a surface S1 of the chip body 1.

Referring to FIG. 1, the chip body 1 may have a rectangular planar shape having first to fourth edge lines E1, E2, E3, and E4. The first and third edge lines E1 and E3 may correspond to short sides of the chip body 1. The second and fourth edge lines E2 and E4 may correspond to long sides of the chip body 1. As an example, the first and third edge lines E1 and E3 may be disposed in a direction parallel to the x-direction, and the second and fourth edge lines E2 and E4 may be disposed in a direction parallel to the y-direction. Accordingly, the first and third edge lines E1 and E3 may be disposed in a direction intersecting the second and fourth edge lines E2 and E4.

The first chips pad 1*a* may be disposed in a first region A of the surface S1 of the chip body 1 along the first edge line E1. The first region A may be a region of the surface S1 of the chip body 1, adjacent to the first edge line E1 along the direction parallel to the x-direction. The first chip pads 1*a* may be arranged in a plural number along the first edge line E1. Meanwhile, the second chip pads 1*b* may be disposed in a second region B of the surface S1 of the chip body 1 along the second edge line E2. The second region B may be a region of the surface S1 of the chip body 1, adjacent to the second edge line E2 along the direction parallel to the y-direction. The second chip pads 1*b* maybe arranged in a plural number along the second edge line E2. In the illustrated embodiment, the chip pads might not be disposed in regions of the surface S1 of the chip body 1, adjacent to the third edge line E3 and the fourth edge line E4.

Figure 2:
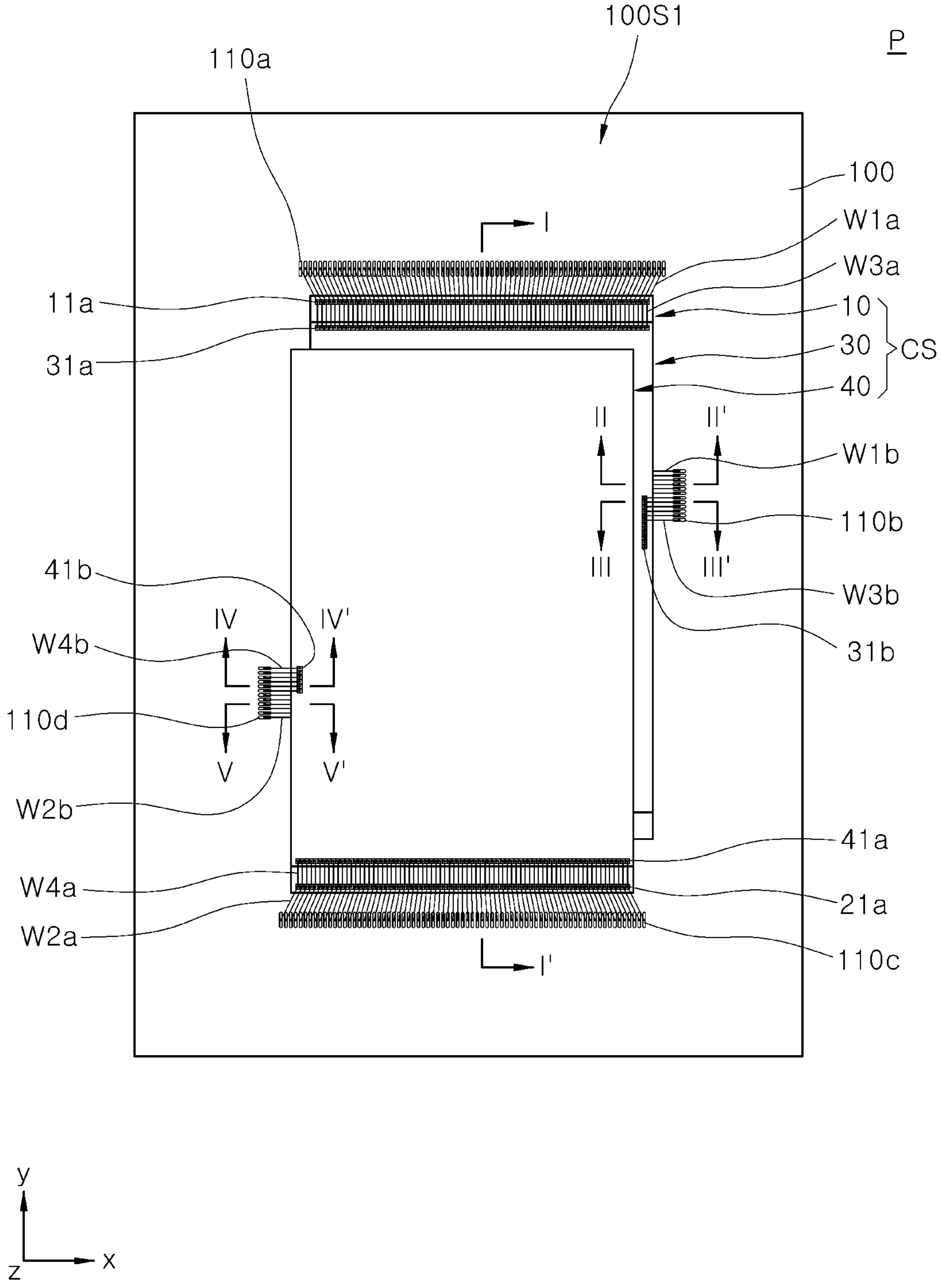
FIG. 2 is a plan view schematically illustrating a semiconductor package according to an embodiment of the present disclosure.
Figure 3:
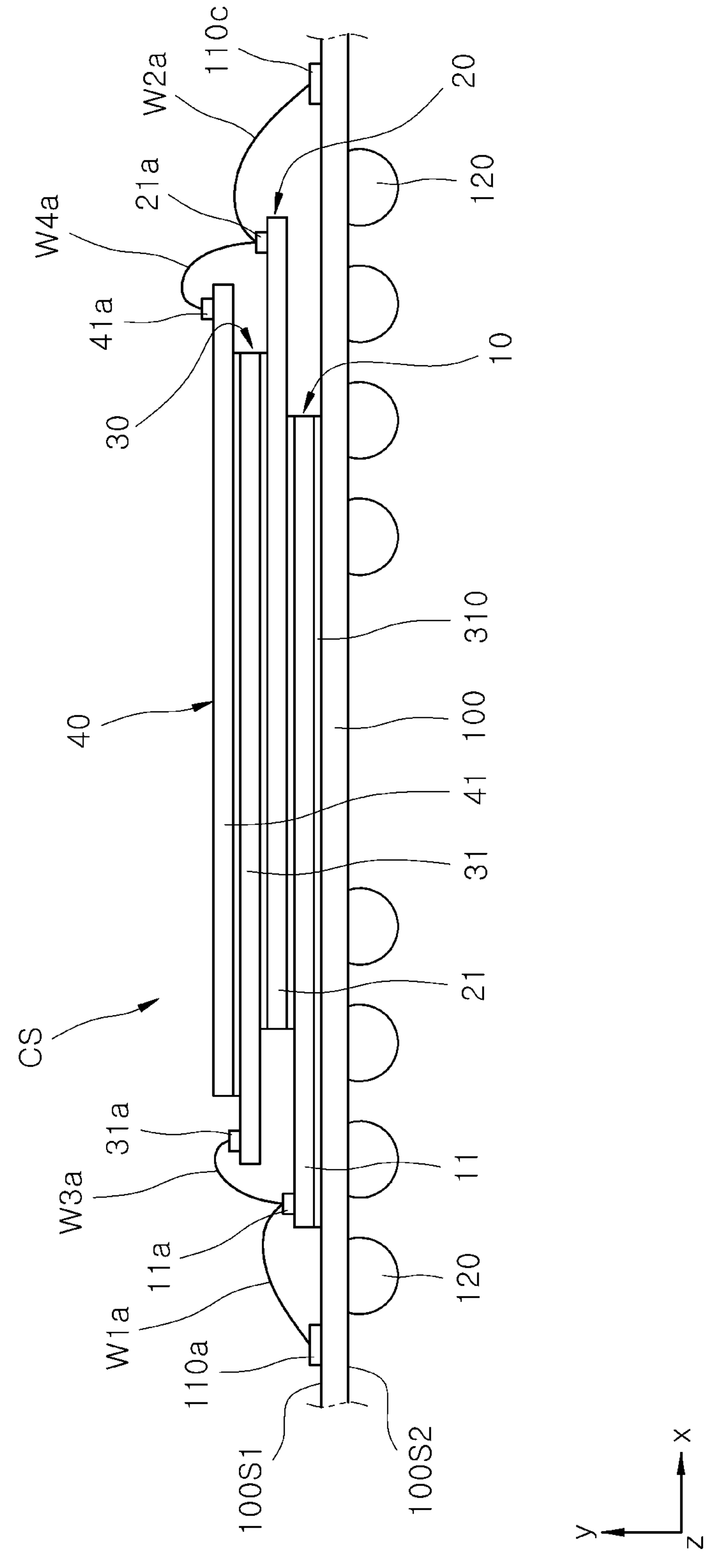
FIG. 3 is a cross-sectional view of the semiconductor package of FIG. 2 taken along line I-I'.
Figure 4:
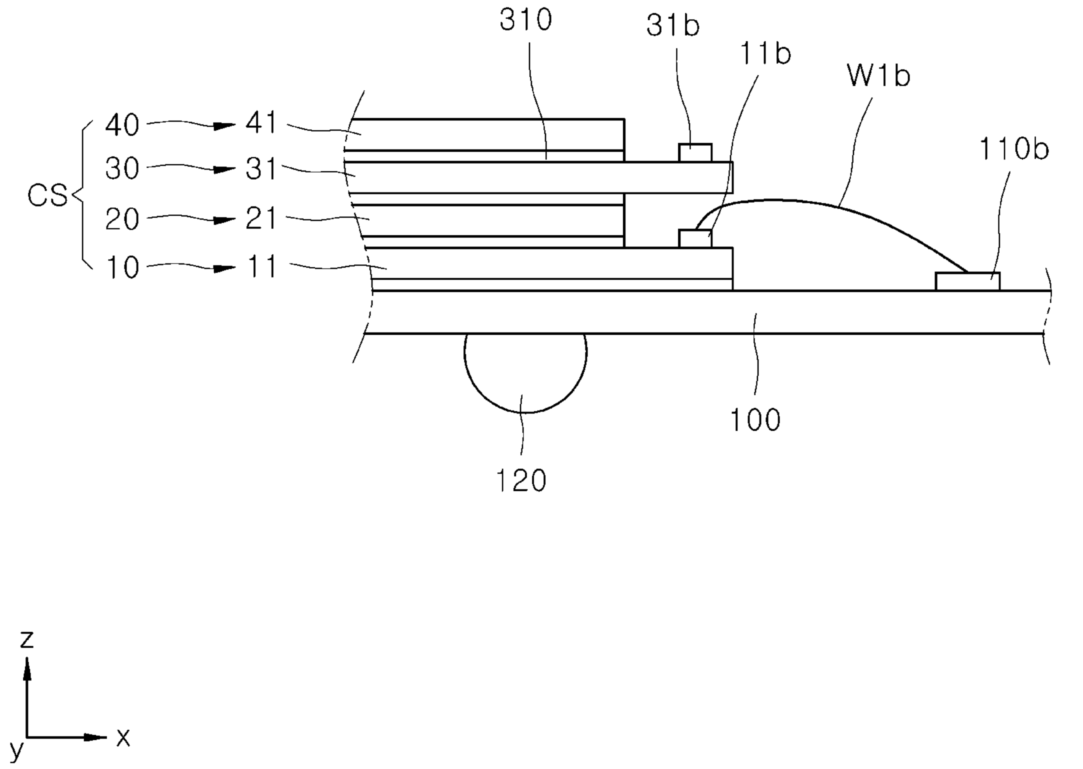
FIG. 4 is a cross-sectional view of the semiconductor package of FIG. 2 taken along line II-II'.
Figure 5:
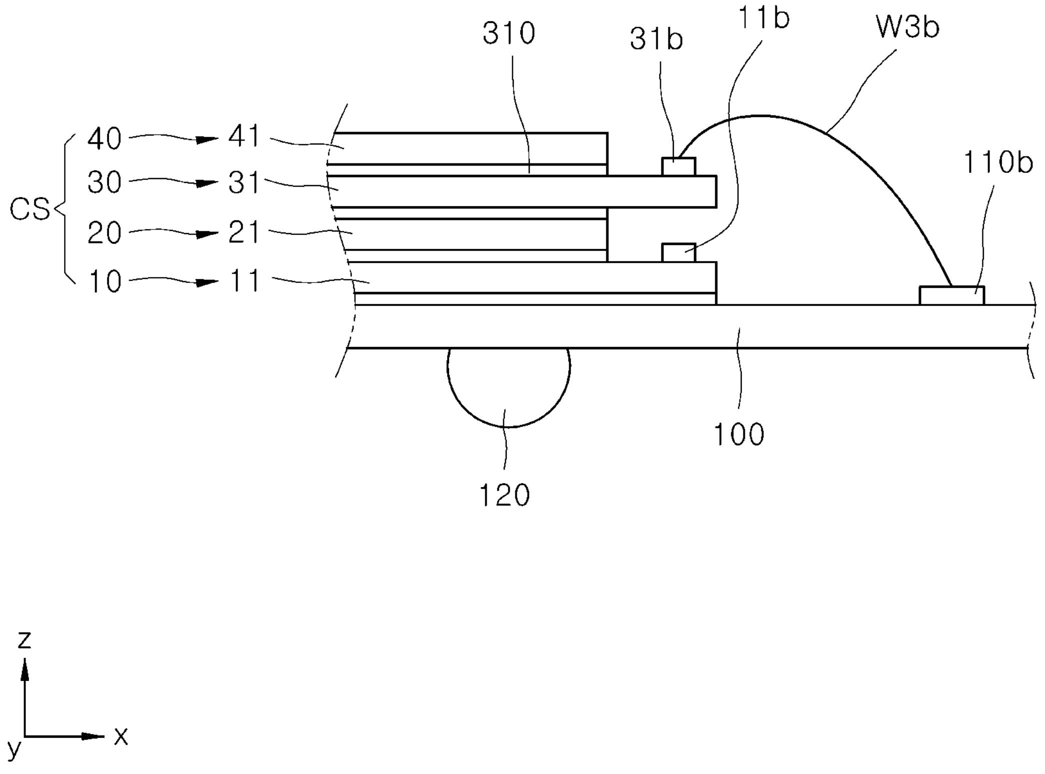
FIG. 5 is a cross-sectional view of the semiconductor package of FIG. 2 taken along line III-III'.
Figure 6:
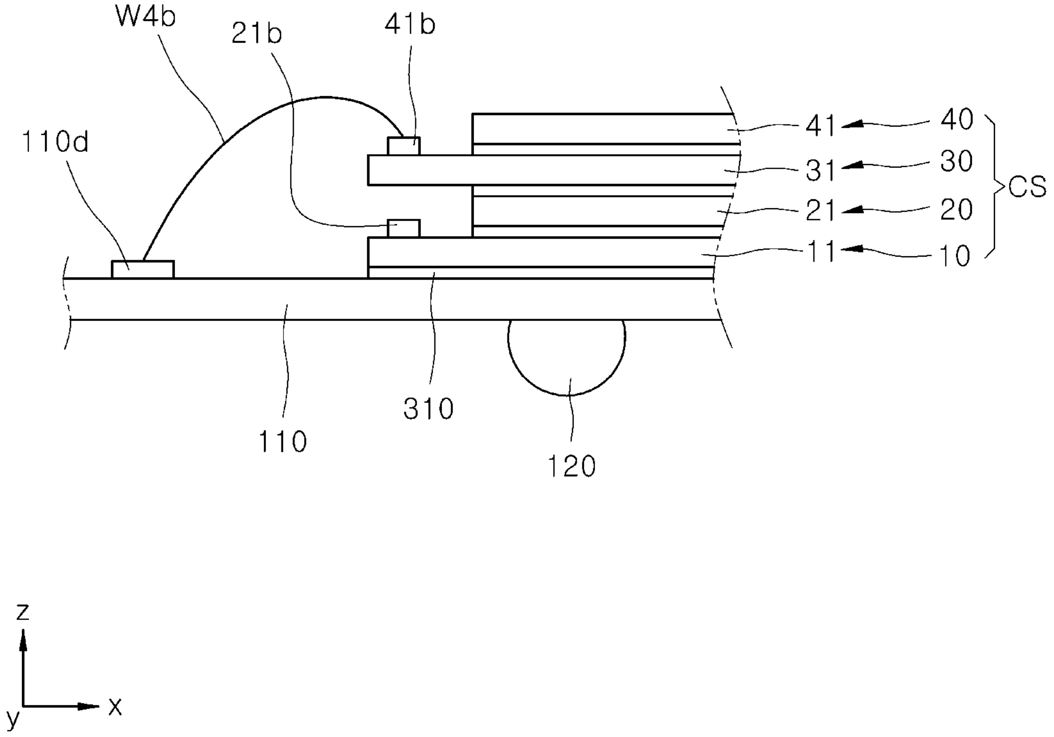
FIG. 6 is a cross-sectional view of the semiconductor package of FIG. 2 taken along line IV-IV'.
Figure 7:
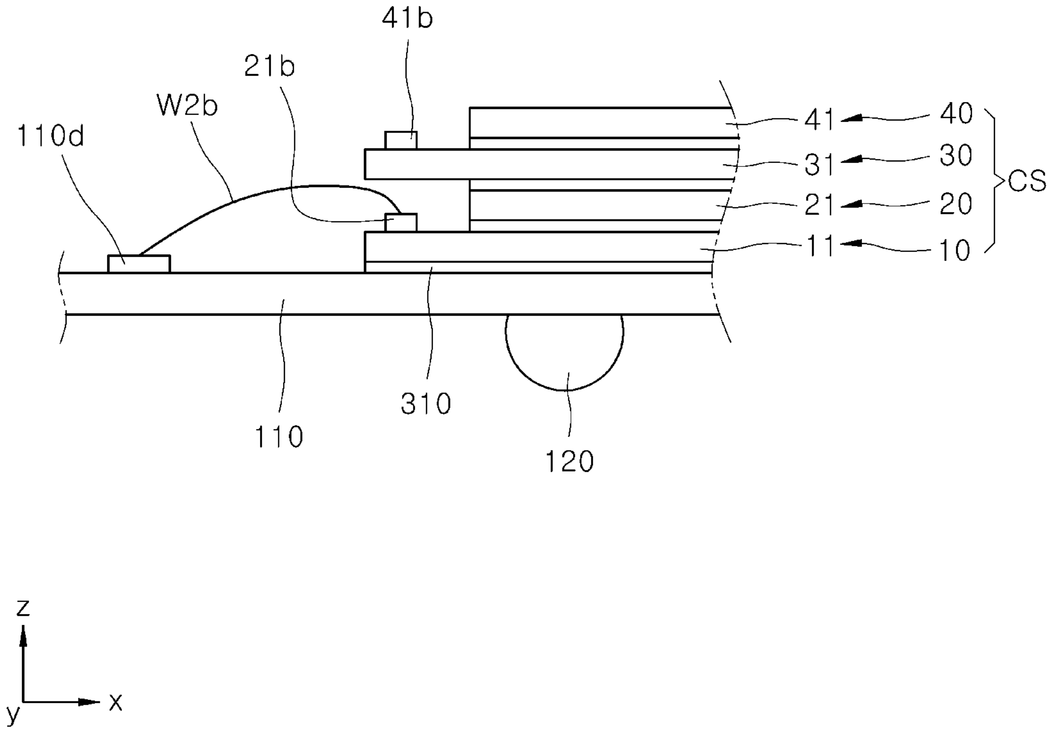
FIG. 7 is a cross-sectional view of the semiconductor package of FIG. 2 taken along line V-V'.

FIG. 2 is a plan view schematically illustrating a semiconductor package P according to an embodiment of the present disclosure. FIG. 3 is a cross-sectional view of the semiconductor package of FIG. 2 taken along line I-I'. FIG. 4 is a cross-sectional view of the semiconductor package of FIG. 2 taken along line II-II'. FIG. 5 is a cross-sectional view of the semiconductor package of FIG. 2 taken along line III-III'. FIG. 6 is a cross-sectional view of the semiconductor package of FIG. 2 taken along line IV-IV'. FIG. 7 is a cross-sectional view of the semiconductor package of FIG. 2 taken along line V-V'.

Referring to FIGS. 2 to 7, the semiconductor package P may include a package substrate 100 and a chip stack CS disposed on the package substrate 100. The chip stack CS may include first to fourth semiconductor chips 10, 20, 30, and 40 which are sequentially stacked on an upper surface 100S1 of the package substrate 100. The first to fourth semiconductor chips 10, 20, 30, and 40 may be the same type of chips. The first semiconductor chip 10 and the package substrate 100, the first semiconductor chip 10 and the second semiconductor chip 20, the second semiconductor chip 20 and the third semiconductor chip 30, and the third semiconductor chip 30 and the fourth semiconductor chip 40 may be bonded to each other by an adhesion layer 310.

Meanwhile, connection structures 120 may be disposed on a lower surface 100S2 of the package substrate 100. The connection structures 120 may electrically connect the package substrate 100 to an external system. The external system may be, for example, a semiconductor package or an electronic device. The connection structures 120 may include, for example, solder balls.

In an embodiment, each of the first to fourth semiconductor chips 10, 20, 30, and 40 may be substantially the same as the semiconductor chip U described above with reference to FIG. 1. As an example, as described later with reference to FIG. 8, the first semiconductor chip 10 may include a chip body 11, first chip pads 11*a* disposed in a first region A11 of a surface S11 of the chip body 11, and second chip pads 11*b* disposed in a second region B11 of the surface S11 of the chip body 11. As described later with reference to FIG. 10, the second semiconductor chip 20 may include a chip body 21, first chip pads 21*a* disposed in a first region A21 of a surface S21 of the chip body 21, and second chip pads 21*b* disposed in a second region B21 of the surface S21 of the chip body 21. As described later with reference to FIG. 11, the third semiconductor chip 30 may include a chip body 31, first chip pads 31*a* disposed in a first region A31 of a surface S31 of the chip body 31, and second chip pads 31*b* disposed in a second region B31 of the surface S31 of the chip body 31. As described later with reference to FIG. 12, the fourth semiconductor chip 40 may include a chip body 41, first chip pads 41*a* disposed in a first region A41 of a surface S41 of the chip body 41, and second chip pads 41*b* disposed in a second region B41 of the surface S41 of the chip body 41.

Referring to FIGS. 2 to 7, the first to fourth semiconductor chips 10, 20, 30, and 40 may be stacked on the upper surface 100S1 of the package substrate 100 to be offset from each other according to a predetermined arrangement method. The arrangement method in which the first to fourth semiconductor chips 10, 20, 30, and 40 are stacked in an offset manner will be described in detail with reference to FIGS. 8 to 12.

Referring to FIGS. 2 and 3, the first chip pads 11*a* of the first semiconductor chip 10 and the first chip pads 21*a* of the second semiconductor chip 20 may be disposed on opposite edge portions of the chip stack CS. That is, the first chip pads 11*a* of the first semiconductor chip 10 and the first chip pads 21*a* of the second semiconductor chip 20 may be disposed at opposite sides from each other over the package substrate 100. Referring to FIG. 3, from an observer's point of view, the first chip pads 11*a* of the first semiconductor chip 10 may be disposed on a left edge portion of the chip stack CS, and the first chip pads 21*a* of the second semiconductor chip 20 may be disposed on a right edge portion of the chip stack CS.

Similarly, the first chip pads 31*a* of the third semiconductor chip 30 and the first chip pads 41*a* of the fourth semiconductor chip 40 may be disposed on opposite edge portions of the chip stack CS. That is, the first chip pads 31*a* of the third semiconductor chip 30 and the first chip pads 41*a* of the fourth semiconductor chip 40 may be disposed at opposite sides from each other over the package substrate 100. Referring to FIG. 3, from an observer's point of view, the first chip pads 31*a* of the third semiconductor chip 30 may be disposed on the left edge portion of the chip stack CS, and the first chip pads 41*a* of the fourth semiconductor chip 40 may be disposed on the right edge portion of the chip stack CS.

Referring to FIGS. 2 and 3 again, the first chip pads 11*a* of the first semiconductor chip 10 and the first chip pads 31*a* of the third semiconductor chip 30 may be disposed on the edge portions of the same side of the chip stack CS, that is, on the left edge portion of the chip stack CS of FIG. 3. That is, the first chip pads 11*a* of the first semiconductor chip 10 and the first chip pads 31*a* of the third semiconductor chip 30 may be disposed adjacent to each other. The first chip pads 31*a* of the third semiconductor chip 30 may be connected to the first chip pads 11*a* of the first semiconductor chip 10 through bonding wires W3*a*. In addition, the first chip pads 11*a* of the first semiconductor chip 10 may be connected to first bond fingers 110*a* disposed adjacent to the first chip pads 11*a* of the first semiconductor chip 10 on the upper surface 100S1 of the package substrate 100 through bonding wires W1*a*. As such, the first and third semiconductor chips 10 and 30 may form cascade wire bonding using the first chip pads 11*a* and 31*a* thereof. The first chip pads 11*a* and 31*a* of the first and third semiconductor chips 10 and 30 may be connected to the first bond fingers 110*a* of the package substrate 100 in common.

In addition, the first chip pads 21*a* of the second semiconductor chip 20 and the first chip pads 41*a* of the fourth semiconductor chip 40 may be disposed on the edge portions of the same side of the chip stack CS, that is, on the right edge portion of the chip stack CS of FIG. 3. In other words, the first chip pads 21*a* of the second semiconductor chip 20 and the first chip pads 41*a* of the fourth semiconductor chip 40 may be disposed adjacent to each other. The first chip pads 41*a* of the fourth semiconductor chip 40 may be connected to the first chip pads 21*a* of the second semiconductor chip 20 through bonding wires W4*a*. In addition, the first chip pads 21*a* of the second semiconductor chip 20 may be connected to third bond fingers 110*c* disposed adjacent to the first chip pads 21*a* of the second semiconductor chip 20 on the upper surface 100S1 of the package substrate 100, through bonding wires W2*a*. As such, the second and fourth semiconductor chips 20 and 40 may form cascade wire bonding using the first chip pads 21*a* and 41*a* thereof. The first chip pads 21*a* and 41*a* of the second and fourth semiconductor chips 20 and 40 may be connected to the third bond fingers 110*c* of the package substrate 100 in common.

Referring to FIG. 2 and FIGS. 4 to 7, the second chip pads 11*b* of the first semiconductor chip 10 and the second chip pads 21*b* of the second semiconductor chip 20 may be disposed on the opposite edge portions of the chip stack CS. That is, the second chip pads 11*b* of the first semiconductor chip 10 and the second chip pads 21*b* of the second semiconductor chip 20 may be disposed at opposite sides from each other over the package substrate 100. Referring to FIGS. 4 to 7, from an observer's point of view, the second chip pads 11*b* of the first semiconductor chip 10 may be disposed on the right edge portion of the chip stack CS, and the second chip pads 21*b* of the second semiconductor chip 20 may be disposed on the left edge portion of the chip stack CS.

Similarly, the second chip pads 31*b* of the third semiconductor chip 30 and the second chip pads 41*b* of the fourth semiconductor chip 40 may be disposed on opposite edge portions of the chip stack CS. That is, the second chip pads 31*b* of the third semiconductor chip 30 and the second chip pads 41*b* of the fourth semiconductor chip 40 may be disposed at opposite sides from each other over the package substrate 100. From an observer's point of view, the second chip pads 31*b* of the third semiconductor chip 30 may be disposed on the right edge portion of the chip stack CS, and the second chip pads 41*b* of the fourth semiconductor chip 40 may be disposed on the left edge portion of the chip stack CS.

Referring to FIGS. 2, 4, and 5 again, the second chip pads 11*b* of the first semiconductor chip 10 and the second chip pads 31*b* of the third semiconductor chip 30 may be disposed on the edge portions of the same side of the chip stack CS. That is, the second chip pads 11*b* of the first semiconductor chip 10 and the second chip pads 31*b* of the third semiconductor chip 30 may be disposed adjacent to each other. Referring to FIGS. 4 and 5, from an observer's point of view, the second chip pads 11*b* of the first semiconductor chip 10 and the second chip pads 31*b* of the third semiconductor chip 30 may be disposed on the right edge portion of the chip stack CS. In addition, the second chip pads 11*b* of the first semiconductor chip 10 and the second chip pads 31*b* of the third semiconductor chip 30 may be connected to second bond fingers 110*b* disposed on the upper surface 100S1 of the package substrate 100 through wire bonding. In this case, the second chip pads 11*b* of the first semiconductor chip 10 and the second chip pads 31*b* of the third semiconductor chip 30 might not be electrically connected to each other. The second chip pads 11*b* of the first semiconductor chip 10 and the second chip pads 31*b* of the third semiconductor chip 30 may be directly connected to the second bond fingers 110*b* through different bonding wires W1*b* and W3*b*, respectively.

Referring to FIGS. 2, 6, and 7 again, the second chip pads 21*b* of the second semiconductor chip 20 and the second chip pads 41*b* of the fourth semiconductor chip 40 may be disposed on the edge portions of the same side of the chip stack CS. That is, the second chip pads 21*b* of the second semiconductor chip 20 and the second chip pads 41*b* of the fourth semiconductor chip 40 may be disposed adjacent to each other. Referring to FIGS. 6 and 7, from an observer's point of view, the second chip pads 21*b* of the second semiconductor chip 20 and the second chip pads 41*b* of the fourth semiconductor chip 40 may be disposed on the left edge portion of the chip stack CS. In addition, the second chip pads 21*b* of the second semiconductor chip 20 and the second chip pads 41*b* of the fourth semiconductor chip 40 may be connected to fourth bond fingers 110*d* disposed on the upper surface 100S1 of the package substrate 100 through wire bonding. In this case, the second chip pads 21*b* of the second semiconductor chip 20 and the second chip pads 41*b* of the fourth semiconductor chip 40 might not be electrically connected to each other. The second chip pads 21*b* of the second semiconductor chip 20 and the second chip pads 41*b* of the fourth semiconductor chip 40 may be directly connected to the fourth bond fingers 110*d* through different bonding wires W2*b* and W4*b*, respectively.

Figure 8:
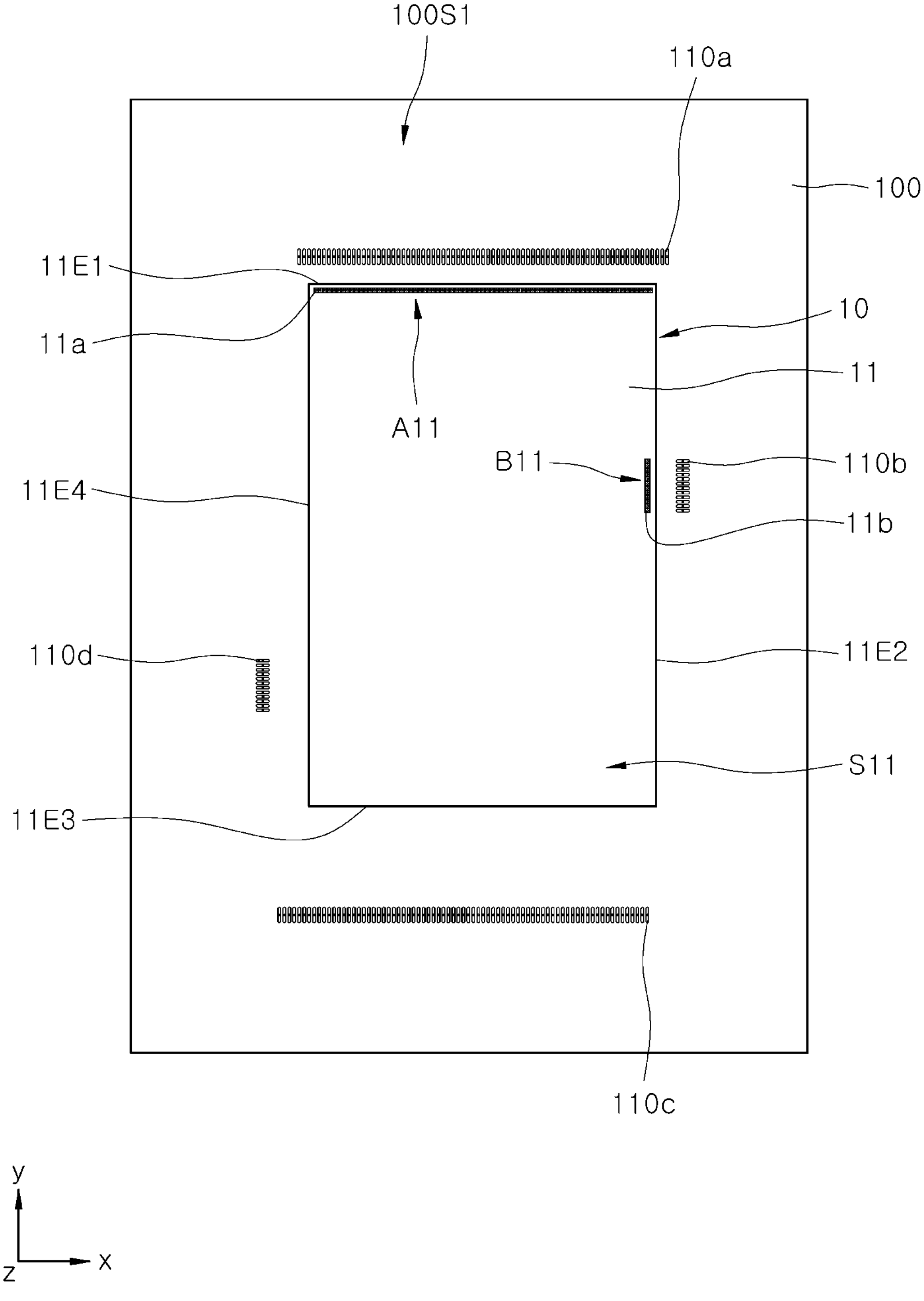
FIGS. 8 to 12 are views schematically illustrating a method of sequentially stacking a plurality of semiconductor chips over a package substrate according to an embodiment of the present disclosure.

FIGS. 8 to 12 are views schematically illustrating a method of sequentially stacking a plurality of semiconductor chips on a package substrate according to an embodiment of the present disclosure. Referring to FIG. 8, a first semiconductor chip 10 may be disposed on an upper surface 100S1 of a package substrate 100. The first semiconductor chip 10 may include a chip body 11, first chip pads 11*a* and second chip pads 11*b* disposed on a surface S11 of the chip body 11.

Referring to FIG. 8, the chip body 11 may have a rectangular planar shape having first to fourth edge lines 11E1, 11E2, 11E3, and 11E4. The first and third edge lines 11E1 and 11E3 may correspond to short sides of the chip body 11. The second and fourth edge lines 11E2 and 11E4 may correspond to long sides of the chip body 11. As an example, the first and third edge lines 11E1 and 11E3 may be disposed in a direction parallel to the x-direction. The second and fourth edge lines 11E2 and 11E4 may be disposed in a direction parallel to the y-direction. Accordingly, the first and third edge lines 11E1 and 11E3 may be disposed in a direction intersecting the second and fourth edge lines 11E2 and 11E4.

The first chip pads 11*a* may be disposed in a first region A11 of the surface S11 of the chip body 11 along the first edge line 11E1. The first region A11 may be a region of the surface S11 of the chip body 11, adjacent to the first edge line 11E1 along the direction parallel to the x-direction. The first chip pads 11*a* may be disposed in a plural number along the first edge line 1E1. Meanwhile, the second chip pads 11*b* may be disposed in a second region B11 of the surface S11 of the chip body 11 along the second edge line 11E2. The second region B11 may be a region of the surface S11 of the chip body 11, adjacent to the second edge line 11E2 along the direction parallel to the y-direction. The second chip pads 11*b* may be disposed in a plural number along the second edge line 11E2. In an illustrated embodiment, the chip pads might not be disposed in regions of the surface S11 of the chip body 11, adjacent to the third and fourth edge lines 11E3 and 11E4.

On the upper surface 100S of the package substrate 100, first bond fingers 110*a* may be disposed adjacent to the first edge line 11E1 of the first semiconductor chip 10. The first bond fingers 110*a* may be disposed in a plural number on the upper surface 100S of the package substrate 100 along the first edge line 11E1 of the first semiconductor chip 10. The first bond fingers 110*a* may be disposed to correspond to the first chip pads 11*a*.

On the upper surface 100S1 of the package substrate 100, second bond fingers 110*b* may be disposed adjacent to the second edge line 11E2 of the first semiconductor chip 10. The second bond fingers 110*b* may be disposed in a plural number along the second edge line 11E2 of the first semiconductor chip 10. The second bond fingers 110*b* may be disposed to correspond to the second chip pads 11*b*.

Meanwhile, on the upper surface 10051 of the package substrate 100, third bond fingers 110*c* may be disposed adjacent to the third edge line 11E3 of the first semiconductor chip 10. The third bond fingers 110*c* may be disposed in a plural number along the third edge line 11E3 of the first semiconductor chip 10. In addition, on the upper surface 10051 of the package substrate 100, fourth bond fingers 110*d* may be disposed adjacent to the fourth edge line 11E4 of the first semiconductor chip 10. The fourth bond fingers 110*d* may be disposed in a plural number along the fourth edge line 11E4 of the first semiconductor chip 10.

Figure 9:
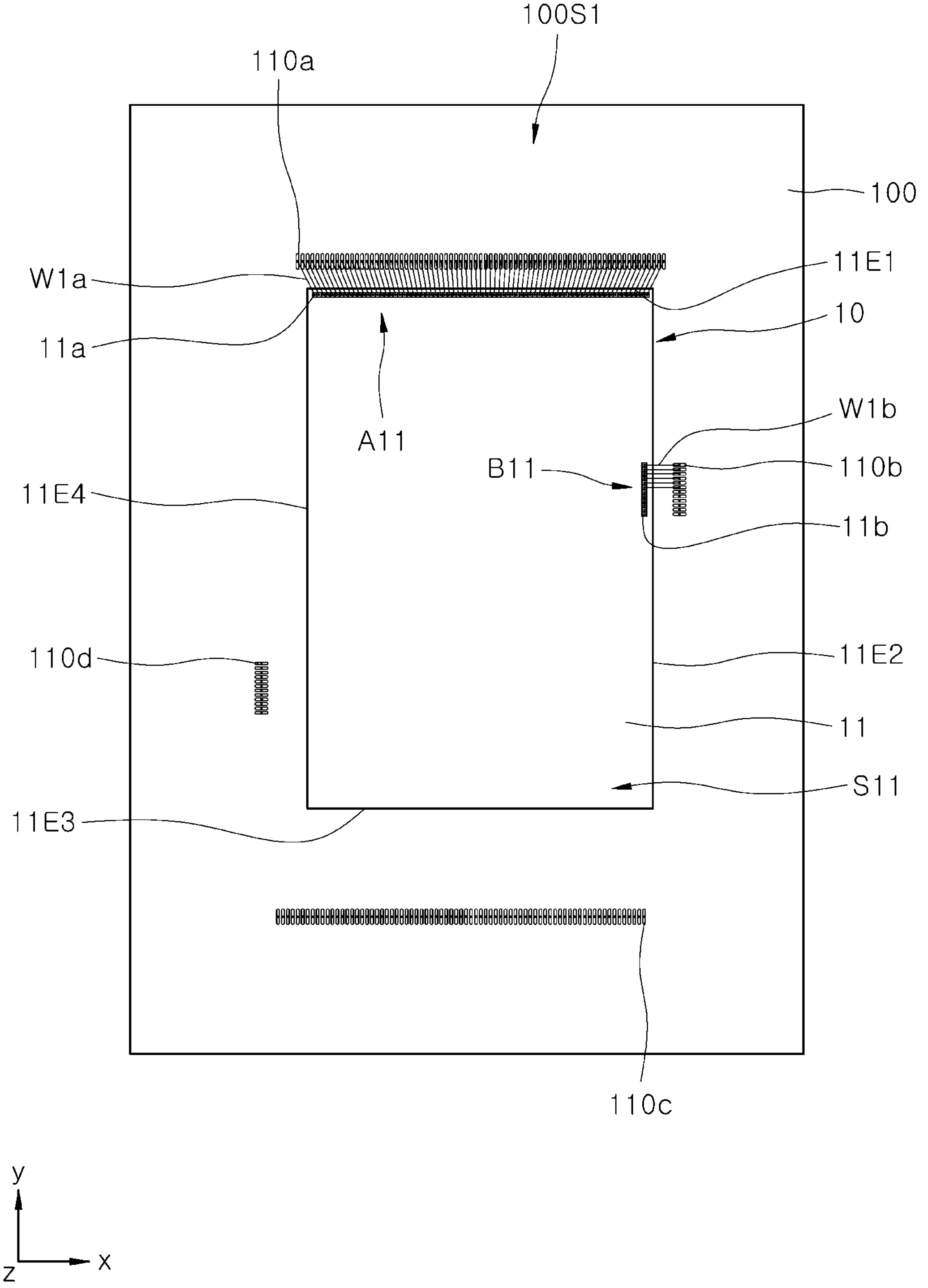

Referring to FIG. 9, the first chip pads 11*a* of the first semiconductor chip 10 and the first bond fingers 110*a* may be wire-bonded through bonding wires W1*a*. In an embodiment, the plurality of first chip pads 11*a* may be respectively wire-bonded with the corresponding first bond fingers 110*a*. In addition, the second chip pads 11*b* of the first semiconductor chip 10 and the second bond fingers 110*b* may be wire-bonded through bonding wires W1*b*. In an embodiment, some of the plurality of second chip pads 11*b* may be wire-bonded with the corresponding second bond fingers 110*b*, and other of the plurality of second chip pads 11*b* might not be connected to the second bond fingers 110*b*.

Figure 10:
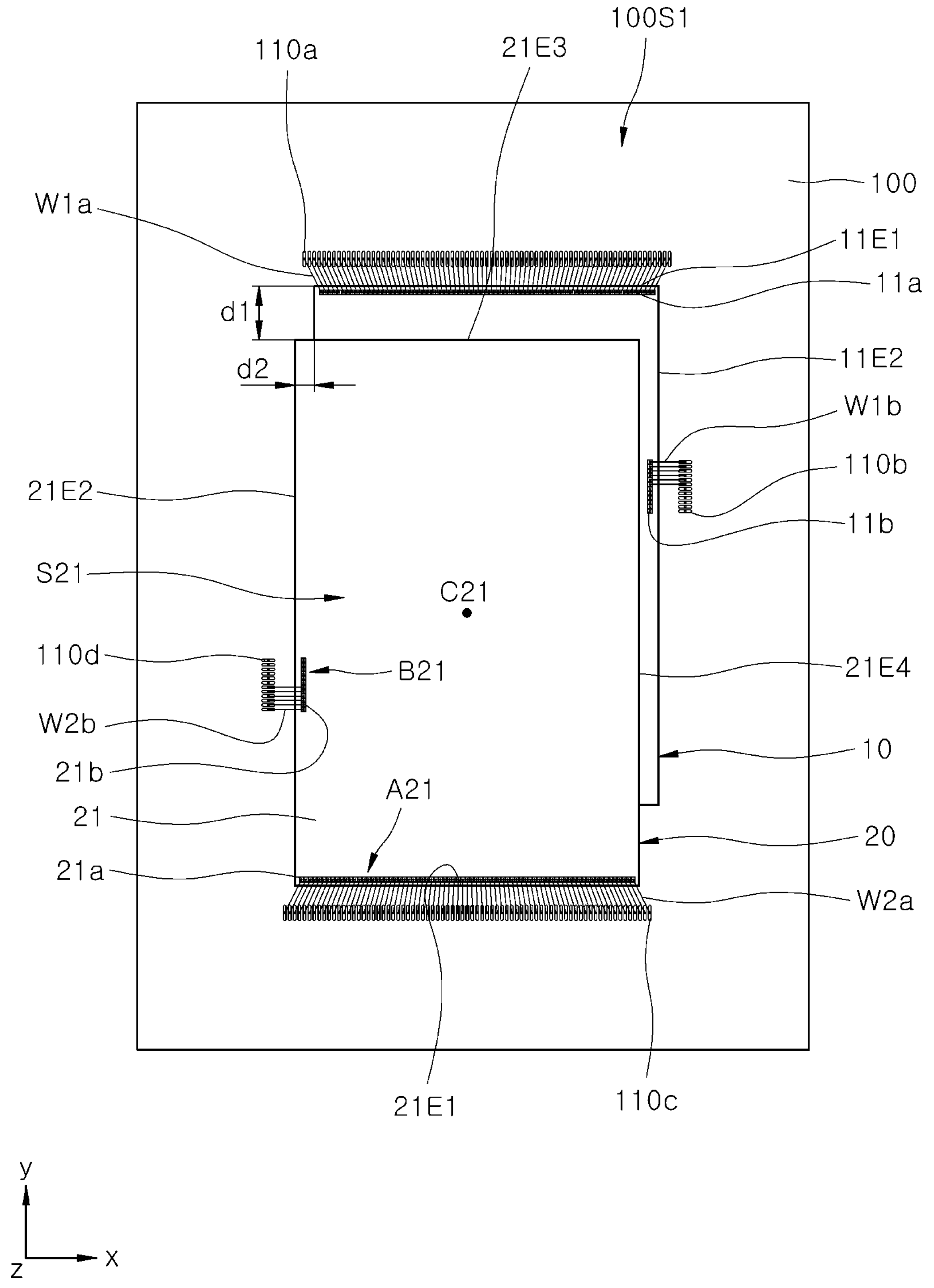

Referring to FIG. 10, a second semiconductor chip 20 may be stacked over the first semiconductor chip 10 to be offset from the first semiconductor chip 10. A configuration of the second semiconductor chip 20 may be substantially the same as that of the first semiconductor chip 10.

Referring to FIGS. 9 and 10 together, a method of arranging the second semiconductor chip 20 may proceed as follows. The second semiconductor chip 20 may be rotated by 180° with respect to a center C21 of the second semiconductor chip 20 with substantially the same arranging configuration as the semiconductor chip 10 of FIG. 9, while overlapping with the first semiconductor chip 10. As an example, the second semiconductor chip 20 may then be disposed to be offset by a first distance d1 in a direction parallel to the second edge line 11E2 of the first semiconductor chip 10, and may be disposed to be offset by a second distance d2 in a direction parallel to the first edge line 11E1 of the first semiconductor chip 10. The second semiconductor chip 20 may be disposed to be offset in the direction parallel to the first edge line 11E1 of the first semiconductor chip 10, so that the second chip pads 11*b* of the first semiconductor chip 10 may be exposed. In addition, the second semiconductor chip 20 may be disposed to be offset in the direction parallel to the second edge line 11E2 of the first semiconductor chip 10, so that the first chip pads 11*a* of the first semiconductor chip 10 may be exposed. Accordingly, it is possible to avoid physical damage of the bonding wires W1*a* connecting the first chip pads 11*a* of the first semiconductor chip 10 to the first bond fingers 110*a* of the package substrate 100 and the bonding wires W1*b* connecting the second chip pads 11*b* of the first semiconductor chip 10 to the second bond fingers 110*b* of the package substrate 100, due to the stacking of the second semiconductor chip 20.

Referring to FIG. 10, first chip pads 21*a* of the second semiconductor chip 20 may be disposed on a surface S21 of a chip body 21 of the second semiconductor chip 20 along a first edge line 21E1 of the chip body 21. The first chip pads 21*a* may be disposed to face third bond fingers 110*c* disposed on the upper surface 100S of the package substrate 100. In addition, second chip pads 21*b* of the second semiconductor chip 20 may be disposed on the surface S21 of the chip body 21 along a second edge line 21E2 of the chip body 21. The second chip pads 21*b* may be disposed to face fourth bond fingers 110*d* disposed on the upper surface 100S of the package substrate 100.

Referring to FIG. 10, the first chip pads 21*a* of the second semiconductor chip 20 may be wire-bonded with the third bond fingers 110*c* through bonding wires W2*a*. In an embodiment, the plurality of first chip pads 21*a* may be respectively wire-bonded with the corresponding third bond fingers 110*c*. In addition, the second chip pads 21*b* of the second semiconductor chip 20 may be wire-bonded with the fourth bond fingers 110*d* through bonding wires W2*b*. In an embodiment, some of the plurality of second chip pads 21*b* may be wire-bonded with the corresponding fourth bond fingers 110*d*, and other of the plurality of second chip pads 21*b* might not be connected to the fourth bond fingers 110*d*.

Figure 11:
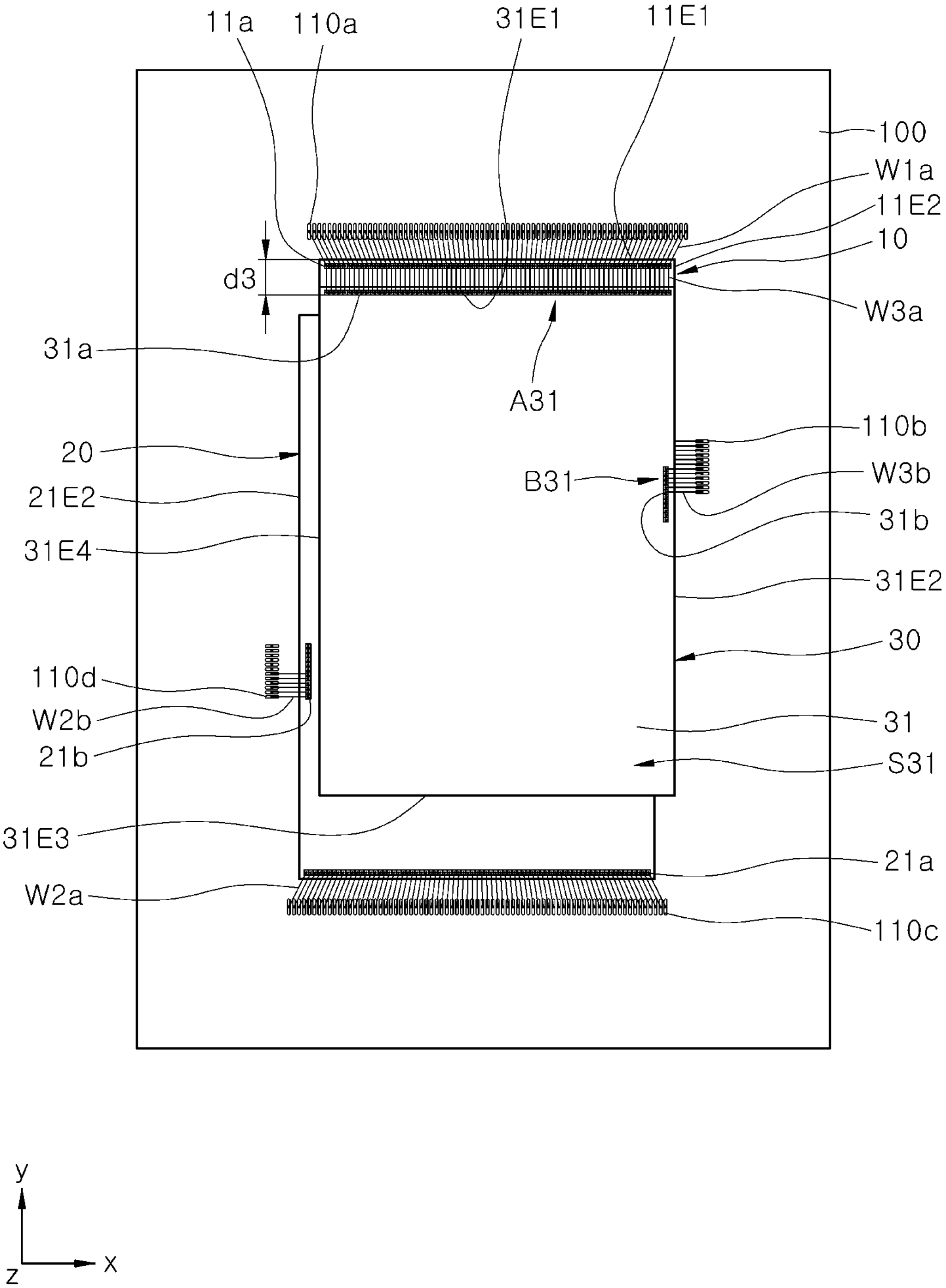

Referring to FIG. 11, a third semiconductor chip 30 may be stacked over the second semiconductor chip 20 to be offset from the second semiconductor chip 20. A configuration of the third semiconductor chip 30 may be substantially the same as the configuration of each of the first and second semiconductor chips 10 and 20.

Referring to FIGS. 10 and 11 together, the third semiconductor 30 may be disposed as follows. In a state in which the third semiconductor chip 30 overlaps the second semiconductor chip 20 overlapping the first semiconductor chip 10, the third semiconductor chip 30 may be disposed to be offset by a third distance d3 in a direction substantially parallel to the second edge line 11E2 of the first semiconductor chip 10, based on the first semiconductor chip 10 (i.e., a direction parallel to the y-direction). The third distance d3 by which the third semiconductor chip 30 is offset may be adjusted in consideration of a distance between the second chip pads 31*b* of the third semiconductor chip 30 and the second bond fingers 110*b* of the package substrate 100 to be wire-bonded. As an example, the third distance d3 may be determined to minimize the distance between the second chip pads 31*b* and the second bond fingers 110*b* to be wire-bonded. Meanwhile, the third semiconductor chip 30 might not be offset in the direction parallel to the first edge line 11E1 of the first semiconductor chip 10, based on the first semiconductor chip 10 (i.e., a direction parallel to the x-direction).

According to the above-described arrangement method, when the third semiconductor chip 30 is stacked over the second semiconductor chip 20, the first chip pads 11*a* of the first semiconductor chip 10 may be exposed, and the second chip pads 11*b* of the first semiconductor chip 10 may be screened. In addition, the first chip pads 21*a* and the second chip pads 21*b* of the second semiconductor chip 20 may be exposed. Accordingly, it is possible to avoid physical damage of the bonding wires W2*a* connecting the first chip pads 21*a* of the second semiconductor chip 20 to the third bond fingers 110*c* of the package substrate 100 and the bonding wires W2*b* connecting the second chip pads 21*b* of the second semiconductor chip 20 to the fourth bond fingers 110*d* of the package substrate 100, due to the stacking of the third semiconductor chip 30.

Referring to FIG. 11, first chip pads 31*a* of the third semiconductor chip 30 may be disposed in on a surface S31 of a chip body 31 of the third semiconductor chip 30 along a first edge line 31E1 of the chip body 31. The first chip pads 31*a* may be disposed to face the first chip pads 11*a* of the first semiconductor chip 10. In addition, second chip pads 31*b* of the third semiconductor chip 30 may be disposed on the surface S31 of the chip body 31 along a second edge line 31E2 of the chip body 31. Some of the plurality of second chip pads 31*b* may be disposed to face some of the plurality of second bond fingers 110*b* disposed on the upper surface 100S of the package substrate 100.

Referring to FIG. 11, the first chip pads 31*a* of the third semiconductor chip 30 and the first chip pads 11*a* of the first semiconductor chip 10 may be bonded to each other by cascade wire bonding. Bonding wires W3*a* may respectively connect the first chip pads 31*a* of the third semiconductor chip 30 and the first chip pads 11*a* of the first semiconductor chip 10 to each other. As an example, the plurality of first chip pads 31*a* of the third semiconductor chip 30 may be respectively connected to the corresponding first chip pads 11*a* of the first semiconductor chip 10.

In addition, the second chip pads 31*b* of the third semiconductor chip 30 may be wire-bonded to the second bond fingers 110*b*. Bonding wires W3*b* may respectively connect the corresponding second chip pads 31*b* and the second bond fingers 110*b* to each other. In an embodiment, the wire bonding between the second chip pads 31*b* and the second bond fingers 110*b* may be performed for some of the plurality of second chip pads 31*b* and some of the plurality of second bond fingers 110*b*. In this case, the second bond fingers 110*b* that are wire-bonded with some of the plurality of second chip pads 31*b* may be the second bond fingers that are not wire-bonded with the second chip pads 11*b* of the first semiconductor chip 10.

Figure 12:
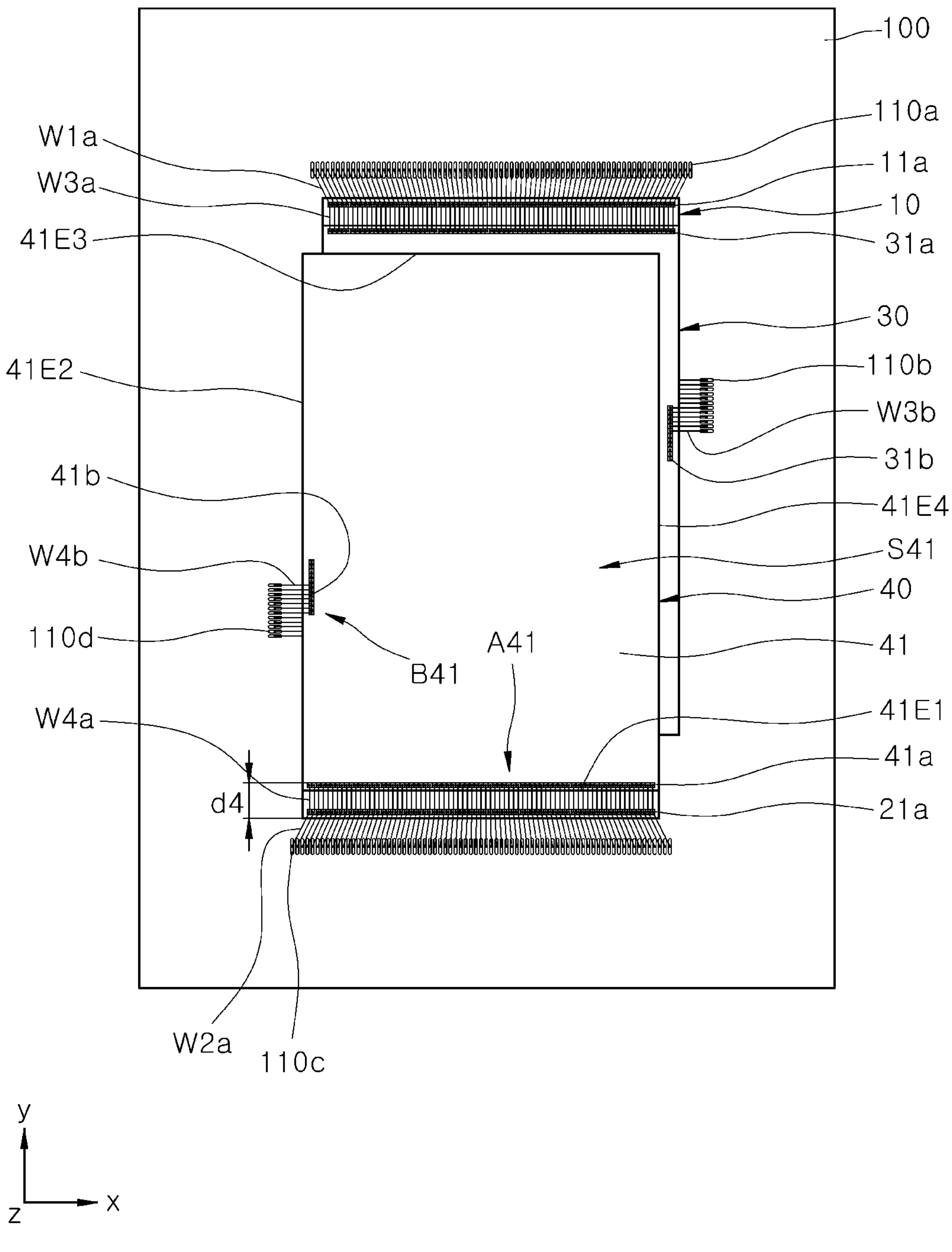

Referring to FIG. 12, a fourth semiconductor chip 40 may be stacked over the third semiconductor chip 30 to be offset with respect to the third semiconductor chip 30. A configuration of the fourth semiconductor chip 40 may be the substantially same as that of each of the first to third semiconductor chips 10, 20, and 30.

Referring to FIGS. 11 and 12 together, the fourth semiconductor chip 40 may be disposed as follows. In a state in which the fourth semiconductor chip 40 overlaps with the third semiconductor chip 30, overlapping the second semiconductor chip 20, the fourth semiconductor chip 40 may be disposed to be offset by a fourth distance d4 in a direction substantially parallel to the second edge line 21E2 of the second semiconductor chip 20, based on the second semiconductor chip 20 (i.e., a direction parallel to the y-direction). The fourth distance d4 by which the fourth semiconductor chip 40 is offset may be adjusted in consideration of a distance between second chip pads 41*b* of the fourth semiconductor chip 40 and fourth bond fingers 110*d* of the package substrate 100 to be wire-bonded. As an example, the fourth distance d4 may be determined to minimize the distance between the second chip pads 41*b* and the fourth bond fingers 110*d* to be wire-bonded. Meanwhile, the fourth semiconductor chip 40 might not be offset in a direction parallel to the first edge line 21E1 of the second semiconductor chip 20, based on the second semiconductor chip 20 (i.e., a direction parallel to the x-direction).

According to the above-described arrangement method, when the fourth semiconductor chip 40 is stacked over the third semiconductor chip 30, the first chip pads 21*a* of the second semiconductor chip 20 may be exposed, and the second chip pads 21*b* of the second semiconductor chip 20 may be screened. In addition, the first chip pads 31*a* and the second chip pads 31*b* of the third semiconductor chip 30 may be exposed. Accordingly, it is possible to avoid physical damage of the bonding wires W3*a* connecting the first chip pads 31*a* of the third semiconductor chip 30 to the first chip pads 11*a* of the first semiconductor chip 10 and the bonding wires W3*b* connecting the second chip pads 31*b* of the third semiconductor chip 30 to the second bond fingers 110*b* of the package substrate 100, due to the stacking of the fourth semiconductor chip 40.

Referring to FIG. 12, first chip pads 41*a* of the fourth semiconductor chip 40 may be disposed on a surface S41 of a chip body 41 of the fourth semiconductor chip 40 along a first edge line 41E1 of the chip body 41. The fourth chip pads 41*a* may be disposed to face the first chip pads 21*a* of the second semiconductor chip 20. In addition, second chip pads 41*b* of the fourth semiconductor chip 40 may be disposed on the surface S41 of the chip body 41 along a second edge line 41E2 of the chip body 41. Some of the plurality of second chip pads 41*b* may be disposed to face some of the fourth bond fingers 110*d* disposed on the upper surface 100S of the package substrate 100.

Referring to FIG. 12, the first chip pads 41*a* of the fourth semiconductor chip 40 may be bonded to the first chip pads 21*a* of the second semiconductor chip 20 by cascade wire bonding. Bonding wires W4*a* may respectively connect the first chip pads 41*a* of the fourth semiconductor chip 40 and the first chip pads 21*a* of the second semiconductor chip 20 to each other. As an example, the plurality of first chip pads 41*a* may be respectively connected to corresponding first chip pads 21*a*.

In addition, the second chip pads 41*b* of the fourth semiconductor chip 40 may be wire-bonded to the fourth bond fingers 110*d*. Bonding wires W4*b* may respectively connect the corresponding second chip pads 41*b* and the fourth bond fingers 110*d* to each other. In an embodiment, the wire bonding between the second chip pads 41*b* and the fourth bond fingers 110*d* may be performed on some of the plurality of second chip pads 41*b* and some of the plurality of fourth bond fingers 110*d*. In this case, the fourth bond fingers 110*d* that are wire-bonded with some of the plurality of second chip pads 41*b* may be the fourth bond fingers that are not wire-bonded to the second chip pads 21*b* of the second semiconductor chip 20.

Figure 13A:
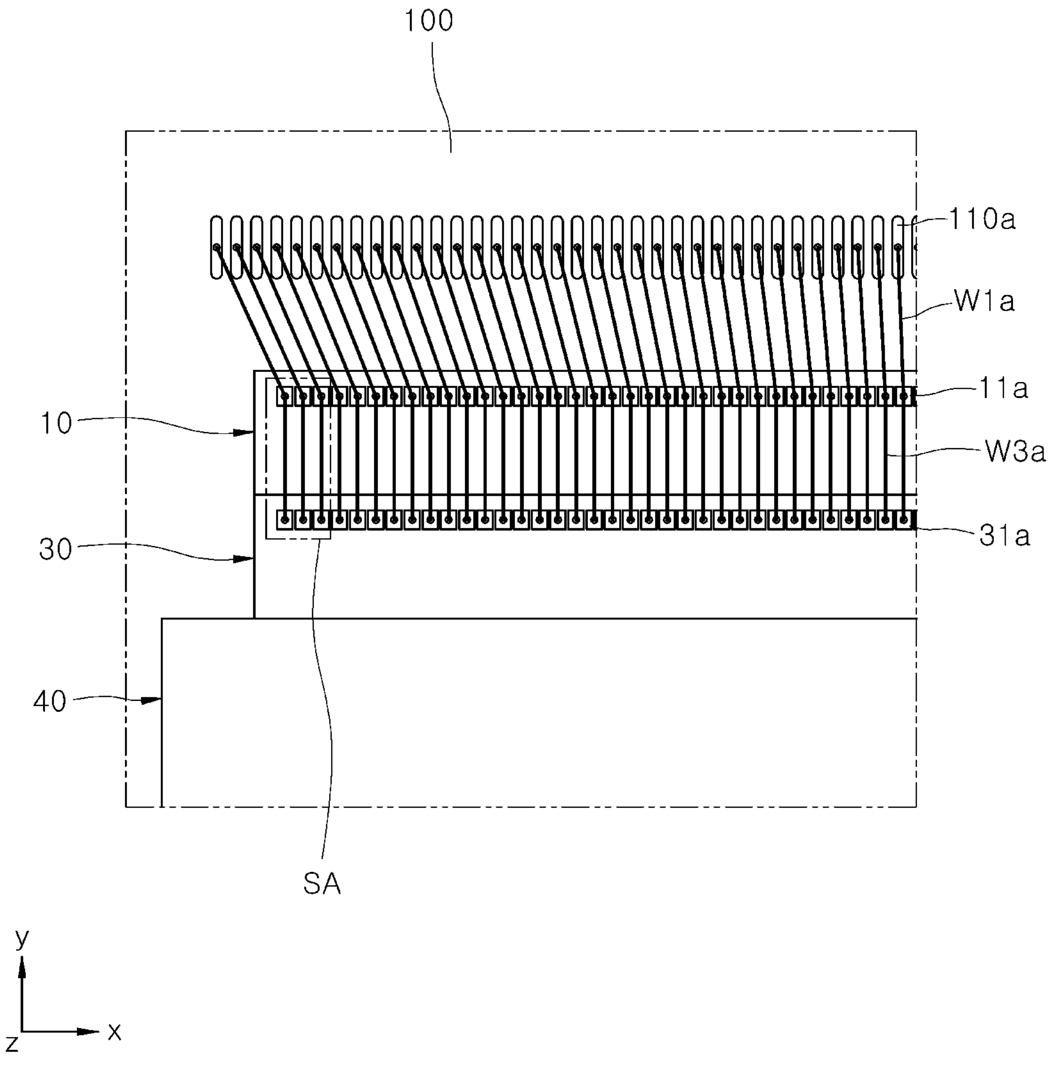
FIG. 13A is a plan view schematically illustrating cascade wire bonding between a plurality of semiconductor chips of a semiconductor package according to an embodiment of the present application.
Figure 13B:
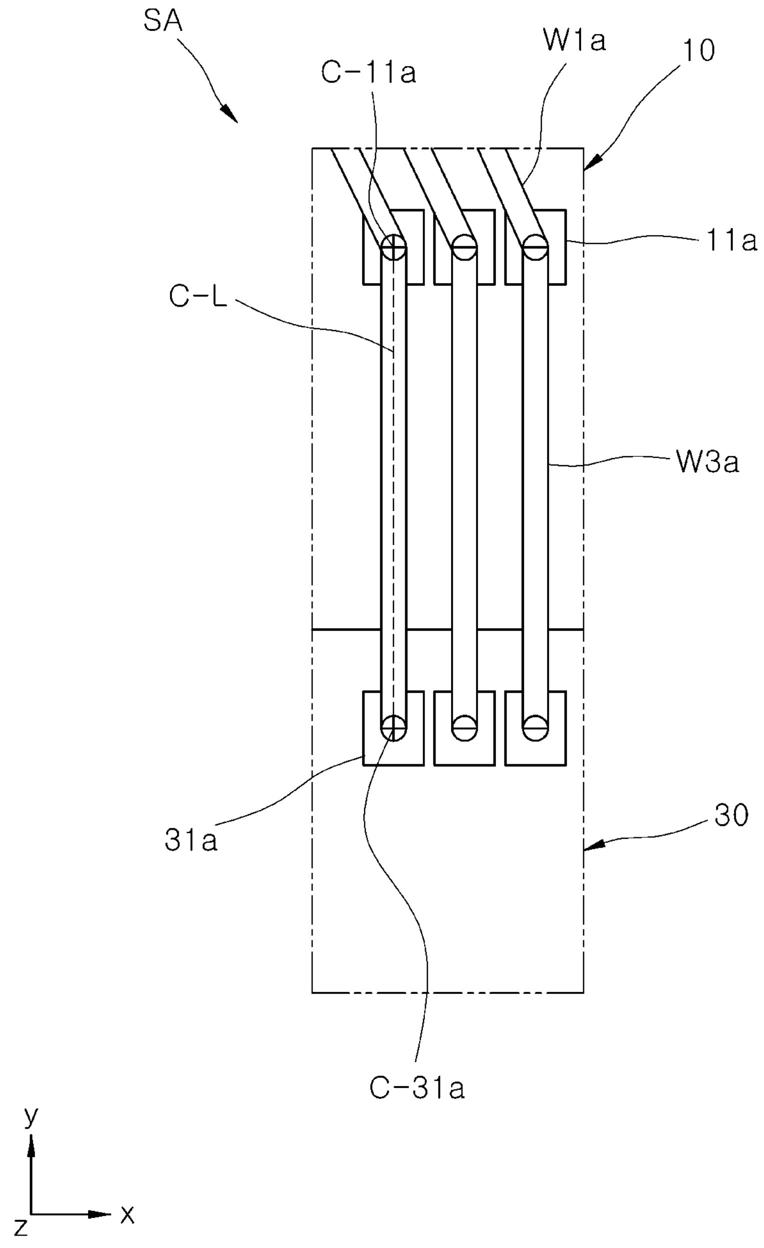
FIG. 13B is an enlarged view of an SA area of FIG. 13A.

FIG. 13A is a plan view schematically illustrating cascade wire bonding between a plurality of semiconductor chips of a semiconductor package according to an embodiment of the present application. In an embodiment, FIG. 13A may be a partially enlarged view of the semiconductor package 1 of FIG. 1. FIG. 13B is an enlarged view of a region SA of FIG. 13A.

Referring to FIGS. 13A and 13B, the first chip pads 31*a* of the third semiconductor chip 30 and the first chip pads 11*a* of the first semiconductor chip 10 may form cascade wire bonding through the bonding wires W3*a*. Each of the bonding wires W3*a* on the plan view of FIG. 13B may substantially overlap with a reference line C-L that connects a center C-11*a* of the first chip pad 11*a* of the first semiconductor chip 10 and a center C-31*a* of the first chip pad 31*a* of the third semiconductor chip 30. That is, on the plan view of FIG. 13B, a wire angle formed by the bonding wire W3*a* with respect to the reference line C-L may be substantially 0°. That is, the wire bonding using the bonding wires W3*a* may be performed to connect the shortest distance between the center C-11*a* of each of the first chip pads 11*a* of the first semiconductor chip 10 and the center C-31*a* of each of the first chip pads 31*a* of the third semiconductor chip 30, on the plan view of FIG. 13B.

Although not illustrated in FIGS. 13A and 13B, on the plan view of FIG. 2, when the first chip pads 21*a* of the second semiconductor chip 20 are connected to the corresponding first chip pads 41*a* of the fourth semiconductor chip 40 by the bonding wires W4*a*, each of the bonding wires W4*a* may substantially overlap with reference lines respectively connecting a center of each of the first chip pads 21*a* of the second semiconductor chip 20 and a center of each of the first chip pads 41*a* of the fourth semiconductor chip 40. That is, a wire angle formed by each of the bonding wires W4*a* with respect to each of the reference lines on the plan view may be substantially 0°. That is, the wire bonding using the bonding wires W4*a* may be performed to connect the shortest distance between the center of each the first chip pads 21*a* of the second semiconductor chip 20 and the center of each of the first chip pads 41*a* of the fourth semiconductor chip 40, on the plan view of FIG. 13B.

As described above, a semiconductor package according to an embodiment of the present disclosure may include a chip stack disposed on a package substrate. The chip stack may include a plurality of semiconductor chips disposed to be offset from each other. According to an embodiment of the present disclosure, each of the plurality of semiconductor chips may include first chip pads disposed in a first region of a surface of a chip body along a first edge line of the chip body, and second chip pads disposed in a second region of the surface of the chip body along a second edge line of the chip body intersecting the first edge line.

Each of the plurality of semiconductor chips may include the first and second chip pads for wire bonding, disposed along different edge lines, and the plurality of semiconductor chips may be disposed to be offset and staggered over the package substrate. In this case, when at least some of the plurality of offset semiconductor chips are connected to each other by cascade wire bonding, difficulty in a cascade wire bonding process may be decreased as the wire angle of each of the bonding wires connecting the chip pads of the some of the semiconductor chips decreases. Conversely, as the wire angle of each of the bonding wires increases, the burden of the wire bonding process may be increased.

According to an embodiment of the present disclosure, because a plurality of semiconductor chips are stacked to be staggered with each other using a new offset method, the wire angle of bonding wires connecting the semiconductor chips to which cascade wire bonding is performed may be effectively reduced. Accordingly, the burden of a wire bonding process may be reduced, and structural reliability of the formed bonding wires may be improved.

Meanwhile, although the semiconductor package P described above with reference to FIG. 2 in the present specification discloses an embodiment in which four semiconductor chips 10, 20, 30, and 40 are stacked over the package substrate 100, the spirit of the present disclosure is not necessarily limited thereto. The semiconductor package P may include various other numbers of semiconductor chips stacked over the package substrate. In this case, various numbers of semiconductor chips may be arranged to be offset in substantially the same manner as the semiconductor chips 10, 20, 30, and 40 of FIG. 2 are offset.

The inventive concept has been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:

a package substrate;

a first semiconductor chip disposed over the package substrate;

a second semiconductor chip stacked over the first semiconductor chip;

a third semiconductor chip stacked over the second semiconductor chip; and a fourth semiconductor chip stacked over the third semiconductor chip, wherein each of the first and second semiconductor chips comprises:

a chip body;

first chip pads disposed in a first region of a surface of the chip body along a first edge line of the chip body; and second chip pads disposed in a second region of the surface of the chip body along a second edge line of the chip body intersecting the first edge line, wherein the first chip pads of the first semiconductor chip and the first chip pads of the second semiconductor chip are disposed at opposite sides from each other over the package substrate, wherein the second chip pads of the first semiconductor chip and the second chip pads of the second semiconductor chip are disposed at opposite sides from each other over the package substrate, and wherein the second semiconductor chip is disposed to be offset with respect to the first semiconductor chip to expose the first chip pads and the second chip pads of the first semiconductor chip, and wherein each of the third and fourth semiconductor chips includes:

a chip body;

first chip pads disposed in a first region of a surface of the chip body along a first edge line of the chip body; and second chip pads disposed in a second region of the surface of the chip body along a second edge line of the chip body intersecting the first edge line, and wherein the third semiconductor chip and the fourth semiconductor chip are disposed to be offset with respect to the first semiconductor chip and the second semiconductor chip, respectively, wherein the first chip pads of the third semiconductor chip and the first chip pads of the fourth semiconductor chip are disposed at opposite sides from each other over the package substrate, and wherein the second chip pads of the third semiconductor chip and the second chip pads of the fourth semiconductor chip are disposed at opposite sides from each other over the package substrate.

2. The semiconductor package of claim 1, wherein the second semiconductor chip, after being substantially rotated by 180° with respect to a center of the second semiconductor chip while overlapping the first semiconductor chip, is offset by a first distance in a direction parallel to the first edge lines of the first semiconductor chip and offset by a second distance in a direction parallel to the second edge line of the first semiconductor chip.

3. The semiconductor package of claim 1, wherein the first and second semiconductor chips are substantially the same type of semiconductor chips as each other.

4. The semiconductor package of claim 1, wherein the first chip pads of the first semiconductor chip are wire-bonded to first bond fingers of the package substrate, disposed in a direction parallel to the first edge line of the first semiconductor chip, wherein the second chip pads of the first semiconductor chip are wire-bonded to second bond fingers of the package substrate, disposed in a direction parallel to the second edge line of the first semiconductor chip, wherein the first chip pads of the second semiconductor chip are wire-bonded to third bond fingers of the package substrate, disposed in a direction parallel to the first edge line of the second semiconductor chip, and wherein the second chip pads of the second semiconductor chip are wire-bonded to fourth bond fingers of the package substrate, disposed in a direction parallel to the second edge line of the second semiconductor chip.

5. The semiconductor package of claim 1, wherein the first to fourth semiconductor chips are substantially the same type of semiconductor chips.

6. The semiconductor package of claim 1, wherein the first chip pads of the third semiconductor chip and the first chip pads of the first semiconductor chip are disposed adjacent to each other over the package substrate, wherein the second chip pads of the third semiconductor chip and the second chip pads of the first semiconductor chip are disposed adjacent to each other over the package substrate, wherein the first chip pads of the fourth semiconductor chip and the first chip pads of the second semiconductor chip are disposed adjacent to each other over the package substrate, and wherein the second chip pads of the fourth semiconductor chip and the second chip pads of the second semiconductor chip are disposed adjacent to each other over the package substrate.

7. The semiconductor package of claim 1, wherein the third semiconductor chip is disposed to be offset in the direction substantially parallel to the second edge line of the first semiconductor chip, based on the first semiconductor chip, and wherein the fourth semiconductor chip is disposed to be offset in the direction substantially parallel to the second edge line of the second semiconductor chip, based on the second semiconductor chip.

8. The semiconductor package of claim 7, wherein the third semiconductor chip is disposed to expose the first chip pads of the first semiconductor chip and to screen the second chip pads of the first semiconductor chip, and wherein the fourth semiconductor chip is disposed to expose the first chip pads of the second semiconductor chip and to screen the second chip pads of the second semiconductor chip.

9. The semiconductor package of claim 7, wherein a direction in which the third semiconductor chip is offset with respect to the first semiconductor chip is opposite to a direction in which the fourth semiconductor chip is offset with respect to the second semiconductor chip.

10. The semiconductor package of claim 1, wherein the first chip pads of the third semiconductor chip are wired-bonded to the first chip pads of the first semiconductor chip, and the second chip pads of the third semiconductor chip are wire-bonded to the bond fingers of the package substrate, and wherein the first chip pads of the fourth semiconductor chip are wire-bonded to the first chip pads of the second semiconductor chip, and the second chip pads of the fourth semiconductor chip are wire-bonded to the bond fingers of the package substrate.

11. The semiconductor package of claim 10, wherein a wire angle for wire bonding the first chip pads of the third semiconductor chip and the first chip pads of the first semiconductor chip is substantially zero degrees (0°) on a plan view, and wherein a wire angle for wire bonding the first chip pads of the fourth semiconductor chip and the first chip pads of the second semiconductor chip is substantially zero degrees (0°) on a plan view.

12. A semiconductor package comprising:

a package substrate;

first and second semiconductor chips stacked over the package substrate;

a third semiconductor chip stacked over the second semiconductor chip; and a fourth semiconductor chip stacked over the third semiconductor chip, wherein each of the first and second semiconductor chips comprises:

a chip body;

first chip pads disposed in a first region of a surface of the chip body along a first edge line of the chip body; and second chip pads disposed in a second region of the surface of the chip body along a second edge line of the chip body intersecting the first edge line, and wherein the second semiconductor chip, after being substantially rotated by 180° with respect to a center of the second semiconductor chip while overlapping with the first semiconductor chip, is offset in a first direction parallel to the first edge line of the first semiconductor chip and offset in a second direction parallel to the second edge line of the first semiconductor chip, and wherein each of the third and fourth semiconductor chips includes:

a chip body;

first chip pads disposed in a first region of a surface of the chip body along a first edge line of the chip body; and second chip pads disposed in a second region of the surface of the chip body along a second edge line of the chip body intersecting the first edge line, and wherein the third semiconductor chip and the fourth semiconductor chip are disposed to be offset with respect to the first semiconductor chip and the second semiconductor chip, respectively, wherein the first chip pads of the third semiconductor chip and the first chip pads of the fourth semiconductor chip are disposed at opposite sides from each other over the package substrate, and wherein the second chip pads of the third semiconductor chip and the second chip pads of the fourth semiconductor chip are disposed at opposite sides from each other over the package substrate.

13. The semiconductor package of claim 12, wherein the second semiconductor chip is disposed to be offset with respect to the first semiconductor chip to expose the first chip pads and the second chip pads of the first semiconductor chip.

14. The semiconductor package of claim 12, wherein the first chip pads of the first semiconductor chip are wire-bonded to first bond fingers of the package substrate, disposed in a direction parallel to the first edge line of the first semiconductor chip, wherein the second chip pads of the first semiconductor chip are wire-bonded to second bond fingers of the package substrate, disposed in a direction parallel to the second edge line of the first semiconductor chip, wherein the first chip pads of the second semiconductor chip are wire-bonded to third bond fingers of the package substrate, disposed in a direction parallel to the first edge line of the second semiconductor chip, and wherein the second chip pads of the second semiconductor chip are wire-bonded to fourth bond fingers of the package substrate, disposed in a direction parallel to the second edge line of the second semiconductor chip.

15. The semiconductor package of claim 12, wherein the third semiconductor chip is disposed to be offset in the direction substantially parallel to the second edge line of the first semiconductor chip, based on the first semiconductor chip, wherein the fourth semiconductor chip is disposed to be offset in the direction substantially parallel to the second edge line of the second semiconductor chip, based on the second semiconductor chip, and wherein a direction in which third semiconductor chip is offset with respect to the first semiconductor chip is opposite to a direction in which the fourth semiconductor chip is offset with respect to the second semiconductor chip.

16. The semiconductor package of claim 15, wherein the third semiconductor chip is disposed to expose the first chip pads of the first semiconductor chip and to screen the second chip pads of the first semiconductor chip, and wherein the fourth semiconductor chip is disposed to expose the first chip pads of the second semiconductor chip and to screen the second chip pads of the second semiconductor chip.

17. The semiconductor package of claim 12, wherein the first chip pads of the third semiconductor chip are wired-bonded to the first chip pads of the first semiconductor chip, and the second chip pads of the third semiconductor chip are wire-bonded to the bond fingers of the package substrate, and wherein the first chip pads of the fourth semiconductor chip are wire-bonded to the first chip pads of the second semiconductor chip, and the second chip pads of the fourth semiconductor chip are wire-bonded to the bond fingers of the package substrate.

* * * * *